United States Patent
Bulinski et al.

(10) Patent No.: US 8,003,004 B2
(45) Date of Patent: Aug. 23, 2011

(54) HEAT TRANSFER APPARATUS AND METHODS INCLUDING HYDROFLUOROCARBONATES

(75) Inventors: Michael J. Bulinski, Houlton, WI (US); Michael G. Costello, Afton, MN (US); Richard M. Flynn, Mahtomedi, MN (US); William M. Lamanna, Stillwater, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 590 days.

(21) Appl. No.: 12/018,285

(22) Filed: Jan. 23, 2008

(65) Prior Publication Data

US 2009/0183856 A1    Jul. 23, 2009

(51) Int. Cl.
*C09K 5/00*    (2006.01)
(52) U.S. Cl. .............................. 252/71; 361/699; 62/114
(58) Field of Classification Search .................. None
See application file for complete search history.

(56) References Cited

U.S. PATENT DOCUMENTS

| | | | |
|---|---|---|---|
| 3,359,296 A | 12/1967 | Newallis et al. | |
| 3,455,954 A | 7/1969 | Prager | |
| 3,699,145 A * | 10/1972 | Sianesi et al. | 558/283 |
| 5,312,955 A | 5/1994 | Pressman et al. | |
| 5,382,704 A | 1/1995 | Krespan et al. | |
| 6,176,094 B1 | 1/2001 | Ohta et al. | |
| RE37,119 E | 4/2001 | Sherwood | |
| 6,374,907 B1 | 4/2002 | Tousignant et al. | |
| 7,055,579 B2 | 6/2006 | Costello et al. | |
| 2005/0127322 A1 | 6/2005 | Costello et al. | |
| 2006/0250775 A1 | 11/2006 | Bjork et al. | |
| 2007/0018134 A1 | 1/2007 | Costello et al. | |
| 2007/0051916 A1 | 3/2007 | Flynn et al. | |
| 2007/0187639 A1 | 8/2007 | Leck et al. | |

FOREIGN PATENT DOCUMENTS

| | | | |
|---|---|---|---|
| EP | 0557167 | * | 8/1993 |
| EP | 0 599 534 | | 4/1997 |
| EP | 0 823 744 | | 10/2005 |
| JP | 2002-343424 | | 5/2001 |
| WO | WO 2006/081282 A1 | | 8/2006 |

OTHER PUBLICATIONS

Journal of Physical Chemistry, B (2005), 109 (7), 2920-2933.*
Bhaskar Veldurthy, and Francois Figueras, "An efficient synthesis of organic carbonates: atom economic protocol with a new catalytic system." *Chem. Comm.*, Issue 6, pp. 734-735 (2004).
Carl G. Krespan, and Bruce E. Smart, "Fluorocarbanion Chemistry. A Versatile Synthesis of Functionalized Fluoro Ketones," *J. Org. Chem.*, vol. 51, pp. 320-326 (1985).
Elaheh K. Goharshadi, and Fatemeh Moosavi, "Prediction of thermodynamic properties of some hydrofluoroether refrigerants using new equation of state," *Fluid Phase Equilibria*, vol. 238, pp. 112-119 (2005).
M.C. Smart, B.V. Ratnakumar, V.S. Ryan-Mowrey, S. Surampudi, G.K.S. Prakash, J. Hu, and I. Cheung, "Improved performance of lithium-ion cells with the use of fluorinated carbonate-based electrolytes," *Journal of Power Sources*, vol. 119-121, pp. 359-367 (2003).
Michele Aresta, Angela Dibenedetto, Elisabetta Fracchiolla, Potenzo Giannoccaro, Carlo Pastore, Imre Papi, and Gabor Schubert, "Mechanism of Formation of Organic Carbonates from Aliphatic Alcohols and Carbon Dioxide under Mild Conditions Promoted by Carbondiimides. DFT Calculation and Experimental Study," *J. Org. Chem.*, vol. 70, pp. 6177-6186 (2005).
ASTM D-3278-96 e-1 "Flash Point of Liquids by Small Scale Closed-Cup Apparatus."

* cited by examiner

*Primary Examiner* — Necholus Ogden, Jr.
(74) *Attorney, Agent, or Firm* — Stephen F. Wolf

(57) ABSTRACT

Provided is an apparatus for heat transfer that includes a device and a mechanism for transferring heat to or from the device, comprising using a heat transfer fluid, wherein the heat transfer fluid includes a hydrofluorocarbonate. Also provided is a method for transferring heat that includes providing a device and using the heat transfer fluid that includes a hydrofluorocarbonate to transfer heat to or from the device.

17 Claims, No Drawings

HEAT TRANSFER APPARATUS AND METHODS INCLUDING HYDROFLUOROCARBONATES

FIELD

The provided apparatus and methods relate to hydrofluorocarbonate fluids and their use as heat transfer fluids.

BACKGROUND

Presently various fluids are used for heat transfer. The suitability of the heat transfer fluid depends upon the application process. For example, some electronic applications require a heat transfer fluid that is inert, has a high dielectric strength, has low toxicity, has good environmental properties, and has good heat transfer properties over a wide temperature range. Other applications require precise temperature control and thus the heat transfer fluid is required to be a single phase over the entire process temperature range and the heat transfer fluid properties are required to be predictable, i.e., the composition remains relatively constant so that the viscosity, boiling point, etc., can be predicted so that a precise temperature can be maintained and so that the equipment can be appropriately designed.

In the semiconductor industry, there are numerous devices or processes that require a heat transfer fluid having select properties. These include testing the performance of semiconductor wafer chips, controlling temperature during reactive plasma etching, producing steppers, operating ashers, operating plasma enhanced chemical vapor deposition (PECVD) chambers, conducting thermal shock tests, and for constant temperature baths. The heat transfer fluid may be used to remove heat, add heat, or maintain a temperature.

SUMMARY

A continuing need exists for heat transfer fluids that are inert, have high dielectric strength, low electrical conductivity, chemical inertness, thermal stability, effective heat transfer, are liquid over a wide temperature range, have good heat transfer properties over a wide range of temperatures, and also have shorter atmospheric lifetimes, and therefore have a lower global warming potential, than existing heat transfer fluids.

In one aspect, an apparatus is provided for heat transfer that includes a device and a mechanism for transferring heat to or from the device, the mechanism comprising a heat transfer fluid, wherein the heat transfer fluid comprises a partially fluorinated carbonate.

In another aspect, a method is provided for transferring heat that includes providing a device and providing a mechanism for transferring heat to or from the device, the mechanism comprising a heat transfer fluid, wherein the heat transfer fluid comprises a partially fluorinated carbonate.

As used throughout this document:

"a", "an", and "the" are used interchangeably with "at least one" to mean one or more of the elements being described;

"catenated heteroatom" refers to an atom other than carbon (for example, oxygen, nitrogen, or sulfur) that is bonded to carbon atoms in a carbon chain so as to form a carbon-heteroatom-carbon chain;

"flash point" refers to a temperature above which a chemical species will spontaneously ignite and is defined in this disclosure by ASTM D-3278-96 e-1 "Flash Point of Liquids by Small Scale Closed-Cup Apparatus";

"inert" refers to chemical compositions that are generally not chemically reactive under normal conditions of use;

"partially fluorinated" refers to fluoroalkyl, fluoroalkylene, or fluorocarbon groups that have at least one carbon-bonded hydrogen atom; and "perfluoro-" (for example, in reference to a group or moiety, such as in the case of "perfluoroalkylene" or "perfluoroalkyl" or "perfluorocarbon") or "perfluorinated" means completely fluorinated such that, except as may be otherwise indicated, there are no carbon-bonded hydrogen atoms replaceable with fluorine.

The provided apparatus and method include partially fluorinated carbonates that can be used as heat transfer fluids. Partially fluorinated carbonates have one or more advantages of high specific heat capacity over a wide range of temperatures, high dielectric strength, low electrical conductivity, chemical inertness, and thermal stability with good environmental properties.

The above summary is not intended to describe each disclosed embodiment of every implementation of the present invention. The detailed description and the examples which follow more particularly exemplify illustrative embodiments.

DETAILED DESCRIPTION

The recitation of numerical ranges includes all numbers within that range (e.g., 1 to 5 includes 1, 1.5, 2, 2.75, 3, 3.80, 4, and 5). All numbers are herein assumed to be modified by the term "about".

Semiconductor processes can incorporate a device or a work-piece that has heat removed from it or has heat added to it. The heat transfer associated with either the heat removal or addition can take place over a wide temperature range. In each case a heat transfer fluid is preferably used which has attributes such as low toxicity and low flammability.

Heat transfer fluids that are presently used in semiconductor applications include perfluorocarbons (PFCs), perfluoropolyethers (PFPEs), perfluoroamines (PFAs), perfluoroethers (PFEs), water/glycol mixtures, deionized water, silicone oils and hydrocarbon oils. PFCs, PFPEs, PFAs and PFEs can exhibit atmospheric lifetime values of greater than 500 years, and up to 5,000 years. Additionally, these materials can exhibit high global warming potentials ("GWP"). GWP is the integrated potential warming due to the release of one (1) kilogram of sample compound relative to the warming due to one (1) kilogram of $CO_2$ over a specified integration time horizon. Water/glycol mixtures are temperature limited, that is, a typical low temperature limit of such mixtures is −40° C. At low temperatures water/glycol mixtures also exhibit relatively high viscosity. The high viscosity at low temperature yields high pumping power. Deionized water has a low temperature limit of 0° C. Silicone oils and hydrocarbon oils are typically flammable.

Provided is an apparatus and a method for heat transfer using partially fluorinated carbonates as a heat transfer fluid. The provided apparatus comprises a device and a mechanism for transferring heat to or from the device wherein the mechanism includes a heat transfer fluid.

Examples of the provided apparatus include, but are not limited to, a test head used in automated test equipment for testing the performance of semiconductor dice, a wafer chuck used to hold silicon wafers in ashers, steppers, etchers, PECVD tools, a constant temperature bath, and a thermal shock test bath.

The provided apparatus comprises a device. The device is a component, work-piece, assembly, etc. to be cooled, heated or maintained at a selected temperature. Such devices include electrical components, mechanical components and optical components. Examples of suitable devices of the provided apparatus include, but are not limited to a microprocessor, a wafer used to manufacture semiconductor devices, a power control semiconductor, an electrochemical cell (including a lithium-ion cell), an electrical distribution switch gear, power transformer, a circuit board, a multi-chip module, a packaged or unpackaged semiconductor device, a fuel cell, and a laser.

In certain embodiments, the apparatus includes a heat transfer mechanism. The heat transfer mechanism, when placed in thermal contact with the device, can remove heat from the device or provide heat to the device, or maintain the device at a selected temperature by removing or providing heat as necessary. By thermal contact it is meant that device and the thermal-transfer fluid are in close enough proximity to enable heat to flow between them. The direction of heat flow (from device or to device) is determined by the relative temperature difference between the device and the heat transfer mechanism. The heat transfer mechanism can include the whole system that is involved in heat transfer exclusive of the device. The system can include facilities for managing the heat transfer fluid. These facilities can include containers, pumps, conduits, thermostats, stirrers, heating means, cooling means, and all other peripheral devices excepting the heat transfer fluid that can be used to control the temperature of a device. The heating means and/or cooling means are well known by those of ordinary skill in the art and include, for example, heating coils or wires or cooling coils. The heat transfer mechanism includes the heat transfer fluid of the provided apparatus. In some embodiments, the heat transfer mechanism can maintain the device at a selected temperature by transferring heat to or from the device as needed to maintain the temperature of the device.

In some embodiments the heat transfer mechanism can include facilities for managing the heat transfer fluid, including, e.g., pumps, valves, fluid containment systems, pressure control systems, condensers, heat exchangers, heat sources, heat sinks, refrigeration systems, active temperature control systems, and passive temperature control systems. Examples of suitable heat transfer mechanisms include, but are not limited to, a system for cooling wafer chucks in plasma-enhanced chemical vapor deposition (PECVD) tools, a system for controlling temperature in test heads for die performance testing, a system for controlling temperatures within semiconductor process equipment, a thermal management system for electrochemical cells such as lithium-ion cells, a system for thermal shock testing of an electronic device, and a system for maintaining constant temperature of an electronic device. Other mechanisms now known or later discovered can be used instead of, or in addition to the recited mechanisms.

In one aspect, the apparatus includes a device, that can be an electronic device, requiring heat transfer and a mechanism for transferring heat to or from the device, the mechanism comprising a heat transfer fluid, wherein the heat transfer fluid includes a partially fluorinated dialkyl carbonate having the structure, $R_hOC(O)OR_h'$. In certain embodiments, the alkyl groups, $R_h$ and $R_h'$, can be identical or different and, independently, can contain from one to 12 carbon atoms. Additionally $R_h$ and $R_h'$ can be linear, branched or cyclic and may, optionally, contain one or more catenated heteroatoms. In at least one of $R_h$ or $R_h'$, at least one hydrogen atom is substituted with a fluorine atom. In some embodiments, from about 35% to about 95% of the hydrogen atoms of the dialkyl carbonate can be substituted with fluorine atoms. In other embodiments from about 50% to about 95% of the hydrogen atoms of the dialkyl carbonate can be substituted with fluorine atoms. In yet other embodiments, from about 60% to about 95% of the hydrogen atoms of the dialkyl carbonate can be substituted with fluorine atoms. In general, the higher the degree of substitution of hydrogen by fluorine atoms, the less flammable the material, which can be a safety advantage. In some embodiments, one of $R_h$ or $R_h'$ can include a hydrocarbon alkyl group.

In some other embodiments, the partially fluorinated dialkyl carbonate can have a structure, $(R_f)R_gOC(O)OR'_g(R_f')_n$. In these embodiments, $R_f$ and $R_f'$ are independently perfluorinated or partially fluorinated linear, branched or cycloaliphatic groups having from 1 to 12 carbon atoms when n is zero or one. When n is one, $R_g$ and $R_g'$ can, independently, be a linear, branched, or cyclic alkylene moiety having from 1 to 6 carbon atoms. $R_g$ and $R_g'$ can contain one or more catenated heteroatoms. When n is zero, $R_g'$ can be a linear, branched, or cyclic alkyl group having from 1 to 6 carbon atoms and can contain one or more catenated heteroatoms.

In other embodiments, the provided apparatus includes a heat transfer fluid that is represented by the following Structure (I).

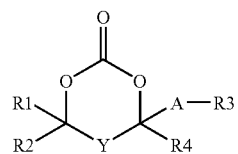

(I)

In Structure (I), each of the groups R1 and R4 can, independently, be hydrogen or a linear, branched, or cyclic alkyl group having from 1 to 6 carbon atoms. R1 and R4 can, optionally, contain one or more catenated heteroatoms. "A" can be a single covalent bond or —CH$_2$O—. R3 can be a perfluorinated or partially fluorinated linear or branched aliphatic group having from 1 to 10 carbon atoms and, optionally, can contain one or more catenated heteroatoms. In R3 at least 70% of the hydrogen atoms can be substituted with fluorine atoms. R2 can be either defined as R1 or R3. Y can be a single covalent bond or the group, C(R5)(R6), where each of R5 and R6 can, independently, be hydrogen, or an alkyl group having from 1 to 4 carbon atoms.

Hydrofluorocarbonates that can be useful include those disclosed in U.S. Pat. Publ. No. 2010/0104950 (Lamanna et al.). Additional hydrofluorocarbonates that can be useful are disclosed, for example, in M. C. Smart et al., *Journal of Power Sources*, 119-121, (2003) p. 359-367, U.S. Pat. No. 3,359,296 (Newallis et al.), and Euro. Pat. Publ. No. EP 599,534 (Yokoyama et al.).

The partially fluorinated carbonates can be used alone or in admixture with each other or with other commonly-used solvents (for example, alcohols, ethers, alkanes, alkenes, perfluorocarbons, perfluorinated tertiary amines, perfluoroethers, cycloalkanes, esters, ketones, aromatics, siloxanes, chlorinated alkanes, chlorinated alkenes, carbonates, fluorinated ketones, fluorinated alkenes, hydrochlorocarbons, hydrochlorofluorocarbons, hydrofluorocarbons, hydrofluoroethers, hydrofluoropolyethers, ionic liquids, and the like, and mixtures thereof). Such co-solvents can be chosen to modify or enhance the properties of a composition for a particular use and can be utilized in ratios (of co-solvent(s) to hydrofluorocarbonate(s)) such that the resulting composition preferably has no flash point. If desired, the hydrofluorocarbonates can be used in combination with other compounds that are very similar in properties relative to a particular use (e.g., other hydrofluorocarbonates) to form compositions that include the provided hydrofluorocarbonates.

Minor amounts of optional components can be added to the compounds to impart particular desired properties for particular uses. Useful compositions can comprise conventional additives such as, for example, surfactants, coloring agents, lubricants, stabilizers, anti-oxidants, flame retardants, and the like, and mixtures thereof.

The provided apparatus and methods can include hydrofluorocarbonates that can be synthesized from their corresponding hydrofluoroalcohols by a number of well known methods used to synthesize organic carbonates. For example, symmetrical organic carbonates can be made by reacting organic alcohols with phosgene (or triphosgene for ease of handling). Unsymmetrical organic carbonates can be synthesized from alkyl chloroformates. Other methods that can be used can include, for example, direct condensation of an alcohol and diethylcarbonate catalyzed by a reusable MgLa mixed oxide as described by Veldurthy et al., *Chemical Communications*, 734 (2004) or the reaction of alcohols with carbon dioxide as disclosed by Aresta et al., *J. Org. Chem.*, 70, 6177 (2005).

Some hydrofluoroalcohols are commercially available. Others can be prepared, for example, by free radical addition of a perfluoroolefin or perfluorovinyl ether and at least one hydrocarbon or addition-capable fluorocarbon alcohol as described in U.S. Pat. Publ. 2007/0051916 (Flynn et al.). Other hydrofluoroalcohols can be obtained by the reduction of their corresponding acids or esters using reducing agents such as $NaBH_4$.

In another aspect, a method is provided for transferring heat that includes providing a device and providing a mechanism for transferring heat to or from the device, comprising a heat transfer fluid, wherein the heat transfer fluid comprises a partially fluorinated carbonate.

In certain embodiments, the processes described in, for example, U.S. Re. Pat. No. 37,119 E (Sherwood) and U.S. Pat. No. 6,374,907 (Tousignant et al.) can be used for heat transfer. In carrying out these processes, heat can be transferred between a heat source (for example, a silicon wafer or a component of a flat panel display) and a heat sink through the use of a heat transfer agent comprising at least one hydrofluoroether compound of the invention. The device can be a heat source or a heat sink depending upon the direction of heat flow (e.g., to or from the device). Unlike some hydrofluorocarbon derivatives that are used as heat transfer agents, the hydrofluorocarbonates of the provided method are not mixtures of components of widely disparate molecular weights. Rather, the hydrofluorocarbonates are generally monodisperse (that is, of a narrow molecular weight range). This means that their physical properties remain relatively constant over time, thereby avoiding significant heat transfer performance deterioration. In addition, the hydrofluorocarbonates of the invention generally exhibit a wide liquid range, useful viscosity over that range, and relatively high thermal stability at end use temperatures, making them well-suited for use as heat transfer fluids.

Hydrofluorocarbonates can have high heat capacities. Additionally, heat transfer fluids made with hydrofluorocarbonates can also have high heat capacities. Specific heat capacities (measured at 20° C.) of the provided heat transfer fluids can be greater than 1.200 J/gK, greater than 1.225 J/gK, greater than 1.250 J/gK, or even greater than 1.260 J/gK.

Objects and advantages of this invention are further illustrated by the following examples, but the particular materials and amounts thereof recited in these examples, as well as other conditions and details, should not be construed to unduly limit this disclosure.

EXAMPLES

Materials 3,3,4,5,5,5-hexafluoropentan-2-ol was made according to the procedure described in Example 3 of U.S. Pat. Publ. 2007/0051916 (Flynn et al.).

3,3,4,5,5,5-hexafluoropentan-2-ol was made according to the procedure described in Example 3 of U.S. Pat. No. 7,691,282 (Flynn et al.).

2,2,3,3,4,4,4-heptafluorobutan-1-ol was made from the methyl ester of heptafluorobutyric acid (available from Alfa Aesar, Ward Hill, Mass.) by sodium borohydride reduction.

2,2,3,3-tetrafluoropropan-1-ol is available from Sinochem, LTD., Beijing, China.

2,2,2-trifluoroethanol is available from Aldrich Chemicals, Milwaukee, Wis.

Example 1

Preparation of bis(3,3,4,5,5,5-hexafluoropentan-2-yl) carbonate 3,3,4,5,5,5-hexafluoropentan-2-ol (150 g, 0.76 mol), pyridine (120 g, 1.5 mol) and methylene chloride (200 mL) were combined in a 1 L 3-neck round bottom flask. The flask was equipped with an overhead stirring mechanism, thermocouple, addition funnel, cold water condenser, $CO_2$/ethylene glycol bath and a nitrogen supply. Triphosgene (40 g, 0.13 mol) was dissolved in 200 mL of methylene chloride and added via an addition funnel at a rate such that the temperature did not exceed 0° C. Once the addition was complete the mix was allowed to warm to room temperature on its own. The reaction mix was then quenched with 250 mL of saturated aqueous ammonium chloride. The methylene chloride product phase was then separated from the aqueous phase. One 200 mL portion of methylene chloride was used to extract product from the aqueous phase. The combined organic extracts were washed with 1×100 mL 1N HCl, 1×100 mL saturated aqueous sodium bicarbonate, 1×100 mL deionized water and then dried over anhydrous magnesium sulfate. The fluorocarbonate product was then purified by distillation, the carbonate being the highest boiling component in the mixture (b.p.=201° C., density at 25° C.=1.555 g/mL, purity=99.7%, recovered yield=87.3%). The structure was confirmed by GC/MS and NMR.

The carbonate prepared in example 1 was evaluated for its stability towards strong acids. To two 5 g samples of the purified carbonate 10 g of 98% sulfuric acid was added. One sample was stirred at room temperature while the other was heated to reflux for 30 min each. At the end of the 30 minutes the samples were phase split from the acid, water washed and the fluorocarbonate phase was evaluated by GC-FID. No increase in alcohol concentration was observed in either sample. The sample which was refluxed with 98% sulfuric acid was then held for a total time of 24 hours at reflux after adding additional water to make an aqueous acid phase. At the end of this time period the fluorocarbonate phase was again analyzed by GC-FID and GC/MS for breakdown to alcohol. The analysis did not show an increase in alcohol concentration or a decrease in overall purity of the fluorocarbonate.

Example 2

Preparation of bis(2,2,3,3-tetrafluoropropyl) carbonate 2,2,3,3-tetrafluoropropan-1-ol (100 g, 0.76 mol), pyridine (120 g, 1.5 mol) and methylene chloride (150 mL) were combined in a 1 L 3-neck round bottom flask. The flask was equipped with an overhead stirring mechanism, thermocouple, addition funnel, cold water condenser, $CO_2$/ethylene glycol bath and a nitrogen line. Triphosgene (40 g, 0.13 mol) was dissolved in 150 mL of methylene chloride and added via an addition funnel at a rate such that the temperature did not exceed 0° C. Once the addition was complete the mix was allowed to warm to room temperature on its own. The reaction mix was then quenched with 200 mL of saturated aqueous ammonium chloride. The methylene chloride product phase was then separated from the aqueous phase. One 200 mL portion of methylene chloride was used to extract product from the aqueous phase. The combined organic extracts were washed with 5×100 mL 1N HCl, 1×100 mL saturated aqueous sodium bicarbonate, 1×100 mL deionized water and then dried over anhydrous magnesium sulfate. The fluorocarbonate product was then purified by distillation, the carbonate being the highest boiling component in the mixture (b.p.=184° C., density at 25° C.=1.5706 g/mL, purity=99.5%). The structure of the product was confirmed by GC/MS and NMR.

Example 3

Preparation of bis(2,2,3,4,4,4-hexafluorobutyl) carbonate 2,2,3,4,4,4-hexafluorobutan-1-ol (140 g, 0.76 mol), pyridine (120 g, 1.5 mol) and methylene chloride (150 mL) were combined in a 1 L 3-neck round bottom flask. The flask was equipped with an overhead stirring mechanism, thermocouple, addition funnel, cold water condenser, $CO_2$/ethylene glycol bath and a nitrogen line. Triphosgene (40 g, 0.13 mol) was dissolved in 150 mL of methylene chloride and added via an addition funnel at a rate such that the temperature did not exceed 0° C. Once the addition was complete the mix was allowed to warm to room temperature on its own. The reaction mix was then quenched with 250 mL of saturated aqueous ammonium chloride. The methylene chloride product phase was then separated from the aqueous phase. One 200 mL portion of methylene chloride was used to extract product from the aqueous phase. The combined organic extracts were washed with 1×100 mL 1N HCl, 1×100 mL saturated aqueous sodium bicarbonate, 1×100 mL deionized water and then dried over anhydrous magnesium sulfate. The fluorocarbonate product was then purified by distillation, the carbonate being the highest boiling component in the mixture (b.p.=197° C., density at 25° C.=1.6302 g/mL, purity=99.7%). The structure was confirmed by GC/MS and NMR.

The following six materials (Examples 4-9) are believed to have high specific heat capacities and should be useful in the provided apparatus.

Example 4

Preparation of bis(2,2,3,3,4,4,4-heptafluorobutyl) carbonate 2,2,3,3,4,4,4-heptafluorobutan-1-ol (152 g, 0.76 mol), pyridine (120 g, 1.5 mol) and methylene chloride (150 mL) were combined in a 1 L 3-neck round bottom flask. The flask was equipped with an overhead stirring mechanism, thermocouple, addition funnel, cold water condenser, $CO_2$/ethylene glycol bath and a nitrogen line. Triphosgene (40 g, 0.13 mol) was dissolved in 150 mL of methylene chloride and added via an addition funnel at a rate such that the temperature did not exceed 0° C. Once the addition was complete the mix was allowed to warm to room temperature on its own. The reaction mix was then quenched with 200 mL of saturated aqueous ammonium chloride. The methylene chloride product phase was then separated from the aqueous phase. One 200 mL portion of methylene chloride was used to extract product from the aqueous phase. The combined organic extracts were washed with 5×100 mL 1N HCl, 1×100 mL saturated aqueous sodium bicarbonate, 1×100 mL deionized water and then dried over anhydrous magnesium sulfate. The fluorocarbonate product was then purified by distillation, the carbonate being the highest boiling component in the mixture (b.p.=167.3° C., density at 2° C.=1.6444 g/mL, purity=98.8%). The structure was confirmed by GC/MS and NMR.

Example 5

Preparation of bis(2,2,2-trifluoroethyl) carbonate 2,2,2-trifluoroethanol (76 g, 0.76 mol), pyridine (120 g, 1.5 mol) and methylene chloride (150 mL) were combined in a 1 L 3-neck round bottom flask. The flask was equipped with an overhead stirring mechanism, thermocouple, addition funnel, cold water condenser, $CO_2$/ethylene glycol bath and a nitrogen line. Triphosgene (40 g, 0.13 mol) was dissolved in 150 mL of methylene chloride and added via an addition funnel at a rate such that the temperature did not exceed 0° C. Once the addition was complete the mix was allowed to warm to room temperature on its own. The reaction mix was then quenched with 200 mL of saturated aqueous ammonium chloride. The methylene chloride product phase was then separated from the aqueous phase. One 200 mL portion of methylene chloride was used to extract product from the aqueous phase. The combined organic extracts were washed with 5×100 mL 1N HCl, 1×100 mL saturated aqueous sodium bicarbonate, 1×100 mL deionized water and then dried over anhydrous magnesium sulfate. The fluorocarbonate product was then purified by distillation, the carbonate being the highest boiling component in the mixture (b.p.=118.5° C., density at 25° C.=1.5679 g/mL, purity=99.5%). The structure was confirmed by GC/MS and NMR.

Example 6

Preparation of Ethyl 2,2,3,4,4,4-hexafluorobutyl carbonate

Ethyl 2,2,3,4,4,4-hexafluorobutyl carbonate was prepared by combining 2,2,3,4,4,4-hexafluorobutan-1-ol (184 g, 1.012 moles, available from Lancaster Synthesis Ltd., Ward Hill, Mass.), triethylamine (102 g, 1.008 moles) and methyl-t-butyl ether (350 mL) in a 1-L round bottom flask that was maintained at a temperature between 5° C. and 15° C. with a $CO_2$/water bath. To the stirred mix, ethylchloroformate (100 g, 0.92 moles) was added from a jacketed addition funnel that was maintained between 5° C. and 15° C. The ethylchloroformate was added over a period of 4 h. Once addition was complete, the reaction mixture was stirred for an additional 16 h and was allowed to warm to room temperature. Then 100 mL of distilled water was added to the reaction mixture. The organic phase was collected. The water phase was extracted twice with 100 mL portions of methyl t-butyl ether and all of the organic phases were combined. The organic phase was washed with a 100 mL portion of distilled water and a 100 mL portion of 1N HCl. The ether was removed by rotary evaporation. The remaining sample was purified by fractional distillation, using a concentric tube column. The product was analyzed by GC/MS.

Example 7

Preparation of Methyl-2,2,3,4,4,4-hexafluorobutyl carbonate

In a predried, two-necked, 500 mL round bottom flask, flushed with nitrogen, and equipped with a thermocouple probe, Claisen adapter, magnetic stir bar, water-cooled condenser and addition funnel, 2,2,3,4,4,4-hexafluorobutan-1-ol (90.00 g, 0.4943 moles, available from Lancaster Synthesis Ltd., Ward Hill, Mass.), triethylamine (62.7 g, 0.6196 moles) and methyl-t-butyl ether (200 mL) were combined. At an initial temperature of 22° C., methylchloroformate (64.12 g, 0.6678 moles) was added dropwise, from the addition funnel, over a 1 h period. During the addition, the temperature rose to 60° C. A white precipitate formed during the reaction. After the complete addition of the methylchloroformate, the reaction mixture was stirred for about 18 h at ambient temperature. The reaction mixture was combined, with stirring, with a premixed solution of 200 mL of 1.023 N HCl and 300 mL of deionized water. The resulting mixture separated into two phases. The organic phase was washed sequentially with 400 mL of water, 400 mL of 5% $Na_2CO_3$, and two 400 mL portions of water. The organic phase was treated for 3 days with activated 3A molecular sieves. The product was collected by fractional distillation, under nitrogen, at atmospheric pressure and a head temperature of 151.2-153.0° C. The product was analyzed by GC/MS and the purity was measured as 98.9% by GC-FID.

Example 8

Preparation of Ethyl 2,2,3,3-tetrafluoropropyl carbonate 2,2,3,3-tetrafluoropropan-1-ol (121 g 0.92 mol), pyridine (76 g 0.96 mol) and 350 mL of methyl-t-butyl ether were combined in a 1 L 3-neck round bottom flask. The flask was equipped with an overhead stirring mechanism, thermocouple, addition funnel, cold water condenser, and a dry nitrogen bubbler. The reaction flask was kept cool using solid $CO_2$ in a water bath. Ethylchloroformate (100 g, 0.92 mol) was added via an addition funnel dropwise at a rate such that the temperature of the reaction mix did not exceed 0° C. Once the addition was complete the mix was allowed to warm to room temperature on its own. The reaction mix was then quenched with 100 mL of water. The water portion was extracted with 2×100 mL portions of methyl t-butyl ether. The combined organic extracts were washed with 100 mL of 1N HCl and 100 mL of water. The solvent was removed by rotary evaporation and the carbonate was purified by fractional distillation using a concentric tube column. The structure of the product was confirmed by GC/MS and the purity by GC-FID was 99.05% of the desired compound.

Example 9

Preparation of 2,2,2-trifluoroethyl methyl carbonate 2,2,2-trifluoroethanol (105 g 1.05 mol), pyridine (87 g 1.1 mol) and 300 mL of methylene chloride were combined in a 1 L 3-neck round bottom flask. The flask was equipped with an overhead stirring mechanism, thermocouple, addition funnel, cold water condenser, and a dry nitrogen bubbler. The reaction flask was kept cool using a dry ice/acetone bath to keep the temperature in the range of −20° C. to −15° C. Methylchloroformate (100 g 1.05 mol) was added via an addition funnel at such a rate that the temperature was kept in the range of −20° C. to −15° C. Once the addition of the methylchloroformate was complete the reaction mix was allowed to warm to room temperature. The reaction mix was then quenched with 100 mL water. The methylene chloride solution was separated from the water and washed with 2×100 mL of 1N HCl. The methylene chloride was removed by distillation and the product was purified using fractional distillation on a concentric tube column (b.p.=90.0° C., purity=99.7%). The structure mass was confirmed by GC/MS.

Measurement of Specific Heat Capacity

Specific Heat Capacity, Cp, was measured using a Perkin Elmer Pyris 1 differential scanning calorimeter (DSC). The samples were weighed using a Perkin Elmer microbalance. The "three-curve" method was used, in which scans were acquired for the empty DSC pan, the Sapphire heat capacity reference disk, and the sample material. Perkin Elmer thermal analysis software was used to calculate the heat capacity and was calibrated against the known heat capacity of a sapphire reference.

Heat Capacity data were taken starting with −20° C. in 20° C. increments, reporting one heat capacity value in the middle of each 20° C. heating range in order to avoid transient data at the beginning and end of each heating range. Data was reported (see Table I) up to the temperature where apparent heat capacity data began to drop, indicating too much pressure and leakage from the crimped aluminum DSC pans (volatile sample pans).

TABLE I

Specific Heat Capacities of Hydrofluorocarbons

| Temp ° C. | Specific Heat Capacity J/g K | | | |
|---|---|---|---|---|
| | Comparative Example 1 | Example 1 | Example 2 | Example 3 |
| −20 | 1.032 | 1.228 | 1.258 | 1.200 |
| 0 | 1.063 | 1.246 | 1.283 | 1.226 |
| 20 | 1.096 | 1.268 | 1.311 | 1.247 |
| 40 | 1.119 | 1.286 | 1.339 | 1.298 |

Table I displays measurement data of the specific heat capacities of a comparative example and three embodiments of the provided heat transfer fluids (Examples 1-3). Comparative Example 1 is a commercial hydrofluoroether compound, $CF_3CF_2CF_2CF(OCH_2CH_3)CF(CF_3)_2$, available as NOVEC 7500 Engineered Fluid, from 3M Company, St. Paul, Minn.

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows. All citations to patents or journal articles in this disclosure are herein incorporated by reference in their entirety.

What is claimed is:

1. An apparatus for heat transfer comprising:
   a device; and a mechanism for transferring heat to or from the device, the mechanism comprising a heat transfer fluid, wherein the device is selected from a microprocessor, a semiconductor wafer used to manufacture a semiconductor device, a power control semiconductor, an electrochemical cell, electrical distribution switch gear, a power transformer, a circuit board, a multi-chip module, a packaged or unpackaged semiconductor device, a fuel cell, and a laser, and wherein the heat transfer fluid comprises a partially fluorinated carbonate.

2. The apparatus according to claim 1 wherein the partially fluorinated carbonate comprises a dialkyl carbonate with the structure, $R_h OC(O)OR_h'$, wherein $R_h$ and $R_h'$, independently, contain a total of from 1 to 12 carbon atoms, are linear, branched, or cyclic, and optionally, may contain one or more catenated heteroatoms.

3. The apparatus according to claim 2 wherein $R_h$ and $R_h'$ are identical.

4. The apparatus according to claim 2 wherein one at least one of $R_h$ or $R_h'$ comprises a hydrocarbon alkyl group.

5. The apparatus according to claim 2 wherein from about 35% to about 95% of the number of hydrogen atoms of the dialkyl carbonate are substituted with fluorine atoms.

6. The apparatus according to claim 5 wherein from about 50% to about 95% of the number of hydrogen atoms of the dialkyl carbonate are substituted with fluorine atoms.

7. The apparatus according to claim 6 wherein from about 60% to about 95% of the number of hydrogen atoms of the dialkyl carbonate are substituted with fluorine atoms.

8. The apparatus according to claim 2 wherein the partially fluorinated carbonate comprises a dialkyl carbonate with the structure, $(R_f)R_g OC(O)OR'_g(R_f')_n$, wherein $R_f$ and $R_f'$ are independently perfluorinated or partially fluorinated linear, branch, or cycloaliphatic groups having from 1 to 12 carbon atoms, and n is 0 or 1;

wherein when n is 1, $R_g$ and $R_g'$ are independently linear, branched or cyclic alkylene groups having from 1 to 6 carbon atoms, and wherein $R_g$ and $R_g'$ can independently contain one or more catenated heteroatoms; and wherein when n is 0, $R_g'$ is a linear, branched, or cyclic alkyl group having from 1 to 6 carbon atoms and can contain one or more catenated heteroatoms.

9. The apparatus according to claim 1 wherein the heat transfer fluid is represented by the following structure:

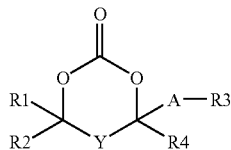

wherein each of the groups R1 and R4 is, independently, hydrogen or a linear, branched or cyclic alkyl group having from 1 to 6 carbon atoms, and optionally, can contain one or more catenated heteroatoms, wherein A is a single covalent bond or $CH_2O$, wherein R3 is a perfluorinated or partially fluorinated linear or branched aliphatic group having from 1 to 10 carbon atoms, and optionally, contains one or more catenated heteroatoms, wherein R2 is hydrogen or a linear, branched or cyclic alkyl group having from 1 to 6 carbon atoms, or a perfluorinated or partially fluorinated linear or branched aliphatic group having from 1 to 10 carbon atoms and, optionally, can contain one or more catenated heteroatoms, and wherein Y is a single covalent bond or the group C(R5)(R6), wherein each of R5 and R6 can, independently, be hydrogen or an alkyl group having from 1 to 4 carbon atoms.

10. The apparatus according to claim 9 wherein at least 70% of the hydrogen atoms in R3 are substituted with fluorine atoms.

11. The apparatus according to claim 1 wherein the heat transfer fluid has a specific heat capacity of greater than 1.200 J/gK at 20° C.

12. The apparatus according to claim 11 wherein the heat transfer fluid has a specific heat capacity of greater than 1.250 J/gK at 20° C.

13. The apparatus according to claim 1, wherein the mechanism transfers heat to the device.

14. The apparatus according to claim 1, wherein the mechanism transfers heat from the device.

15. The apparatus according to claim 1, wherein the mechanism maintains the device at a selected temperature.

16. The apparatus according to claim 1, wherein the mechanism for transferring heat is a component in a system for cooling the device, wherein the system is selected from a system for cooling wafer chucks in PECVD tools, a system for controlling temperature in test heads for die performance testing, a system for controlling temperatures within semiconductor process equipment, a thermal shock testing of an electronic device, and a system for maintaining a constant temperature of an electronic device.

17. A method for transferring heat comprising:
providing a device; and
providing a mechanism for transferring heat to or from the device, the mechanism comprising a heat transfer fluid, wherein the device is selected from a microprocessor, a semiconductor wafer used to manufacture a semiconductor device, a power control semiconductor, an electrochemical cell, electrical distribution switch gear, a power transformer, a circuit board, a multi-chip module, a packaged or unpackaged semiconductor device, a fuel cell, and a laser, and wherein the heat transfer fluid comprises a partially fluorinated carbonate.

* * * * *

UNITED STATES PATENT AND TRADEMARK OFFICE
CERTIFICATE OF CORRECTION

PATENT NO. : 8,003,004 B2
APPLICATION NO. : 12/018285
DATED : August 23, 2011
INVENTOR(S) : Michael John Bulinski Page 1 of 1

It is certified that error appears in the above-identified patent and that said Letters Patent is hereby corrected as shown below:

Column 4,
Lines 13-19, delete "1 to 12 . . . heteroatoms" and insert the same in column 4,
line 12, after the word "from" as a continuation of the same paragraph.

Column 6,
Line 14, delete "3" and insert --2-- therefor.

Column 11,
Line 19, Claim 4, delete the word "one".

Signed and Sealed this
Twelfth Day of June, 2012

David J. Kappos
*Director of the United States Patent and Trademark Office*